(12) United States Patent
Kariyada et al.

(10) Patent No.: US 9,653,677 B2
(45) Date of Patent: May 16, 2017

(54) MAGNETORESISTIVE EFFECT ELEMENT AND MAGNETIC MEMORY

(71) Applicant: Renesas Electronics Corporation, Kawasaki-shi, Kanagawa (JP)

(72) Inventors: Eiji Kariyada, Kawasaki (JP); Katsumi Suemitsu, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 334 days.

(21) Appl. No.: 13/744,269

(22) Filed: Jan. 17, 2013

(65) Prior Publication Data
US 2013/0187248 A1   Jul. 25, 2013

(30) Foreign Application Priority Data

Jan. 20, 2012   (JP) ................................ 2012-010359

(51) Int. Cl.
| | | |
|---|---|---|
| *H01L 43/08* | (2006.01) | |
| *H01L 43/02* | (2006.01) | |
| *H01L 43/10* | (2006.01) | |
| *H01L 27/22* | (2006.01) | |

(52) U.S. Cl.
CPC .............. *H01L 43/02* (2013.01); *H01L 43/08* (2013.01); *H01L 43/10* (2013.01); *H01L 27/228* (2013.01)

(58) Field of Classification Search
None
See application file for complete search history.

(56) References Cited

U.S. PATENT DOCUMENTS

| 7,663,197 B2 | 2/2010 | Nagase et al. |
| 7,768,824 B2 | 8/2010 | Yoshikawa et al. |
| 7,834,410 B2 | 11/2010 | Wang et al. |
| (Continued) | | |

FOREIGN PATENT DOCUMENTS

| CN | 101859870 A | 10/2010 |
| JP | 2006-080116 A | 3/2006 |
| (Continued) | | |

OTHER PUBLICATIONS

Djayaprawira et al., "230% room-temperature magnetoresistance in CoFeB/MgO/CoFeB magnetic tunnel junctions", Applied Physics Letters, 86, 092502, 2005.

(Continued)

*Primary Examiner* — Whitney T Moore
*Assistant Examiner* — Scott R Wilson
(74) *Attorney, Agent, or Firm* — McGinn IP Law Group, PLLC

(57) ABSTRACT

The present invention makes it possible to inhibit an MR ratio from decreasing by high-temperature heat treatment in a magnetoresistive effect element using a perpendicular magnetization film. The magnetoresistive effect element includes a data storage layer, a data reference layer, and an MgO film interposed between the data storage layer and the data reference layer. The data storage layer includes a CoFeB film coming into contact with the MgO film, a perpendicular magnetization film, and a Ta film interposed between the CoFeB film and the perpendicular magnetization film. The CoFeB film is magnetically coupled to the perpendicular magnetization film through the Ta film.

20 Claims, 13 Drawing Sheets

(56) References Cited

U.S. PATENT DOCUMENTS

| | | | |
|---|---|---|---|
| 8,514,616 B2 | 8/2013 | Ishiwata et al. | |
| 9,042,165 B2 | 5/2015 | Ikeda et al. | |
| 2006/0056115 A1* | 3/2006 | Djayaprawira et al. | 360/324.2 |
| 2009/0080238 A1* | 3/2009 | Yoshikawa et al. | 365/158 |
| 2010/0188890 A1 | 7/2010 | Fukami et al. | |
| 2011/0129691 A1* | 6/2011 | Ishiwata | B82Y 25/00 428/828 |
| 2013/0028013 A1* | 1/2013 | Ikeda et al. | 365/158 |
| 2014/0010004 A1* | 1/2014 | Suzuki | 365/158 |

FOREIGN PATENT DOCUMENTS

| | | |
|---|---|---|
| JP | 2007-142364 A | 6/2007 |
| JP | 2009-81216 A | 4/2009 |
| JP | 2009-200123 A | 9/2009 |
| JP | 2011-155073 A | 8/2011 |
| WO | WO 2009/001706 A1 | 12/2008 |
| WO | WO 2010/095589 A1 | 8/2010 |

OTHER PUBLICATIONS

Japanese Office Action dated Jun. 23, 2015 with a partial English translation.
Chinese Office Action dated Jul. 21, 2016 and English Translation thereof.

\* cited by examiner

| | INSERTED FILM TYPE | | |  |
| --- | --- | --- | --- | --- |
| | Ta (EMBODIMENT) | Ru (COMPARATIVE EXAMPLE) | | |
| PEELING TEST | 0/100 | 2/100 | 300 | PROCESS TEMPERATURE (°C) |
| | 0/100 | 76/100 | 325 | |
| | 0/100 | 98/100 | 350 | |

# MAGNETORESISTIVE EFFECT ELEMENT AND MAGNETIC MEMORY

CROSS-REFERENCE TO RELATED APPLICATIONS

The disclosure of Japanese Patent Application No. 2012-010359 filed on Jan. 20, 2012 including the specification, drawings and abstract is incorporated herein by reference in its entirety.

BACKGROUND

The present invention relates to a magnetoresistive effect element and a magnetic memory. In particular, the present invention relates to a magnetoresistive effect element and a magnetic memory using a perpendicular magnetization film.

In a magnetic memory such as a magnetic random access memory (MRAM), a magnetoresistive effect element is used as a memory cell. A typical magnetoresistive effect element has a magnetic tunnel junction (MTJ) in which a tunnel barrier layer is interposed between two ferromagnetic layers.

A resistance value of an MTJ varies in accordance with the magnetization state of the two ferromagnetic layers. Specifically, a resistance value (R+ΔR) of an MTJ in the case where the magnetization directions of the two ferromagnetic layers are "not parallel" is larger than a resistance value (R) in the case where they are "parallel". Consequently, it is possible to vary a resistance value of an MTJ by fixing the magnetization direction of one ferromagnetic layer and inverting the magnetization direction of the other ferromagnetic layer.

Magnitude of such a resistance value is related to a data "1" or "0". That is, a magnetoresistive effect element memorizes data in a nonvolatile manner by using variation of the resistance value of an MTJ. In the two ferromagnetic layers, a layer with a fixed magnetization direction is hereunder referred to as a "data reference layer". The other ferromagnetic layer the magnetization state of which varies in accordance with stored data is hereunder referred to as a "data storage layer".

Data are writted by varying the magnetization state of a data storage layer. As methods for writing data, an external magnetic field application method, a spin injection method, and a domain wall displacement method are named. Patent Literature 1 discloses an MRAM using a spin injection method or a domain wall displacement method. Further, Patent Literature 2 discloses an MRAM of a domain wall displacement type using a perpendicular magnetization film. According to Patent Literature 2, writing current can be reduced sufficiently by forming a data storage layer with a perpendicular magnetization film.

Data are read by making readout current flow between a data storage layer and a data reference layer through a tunnel barrier layer and detecting the magnitude of the resistance value of an MTJ. On this occasion, it is desirable for judging data accurately and quickly that an MR ratio (ΔR/R) is as high as possible. That is, a high MR ratio is indispensable for realizing a good readout property.

Patent literature 3 and Non-Patent Literature 1 disclose a film configuration allowing a high MR ratio to be materialized. According to Patent Literature 3, a tunnel barrier layer is an MgO film of a single-crystal structure and the part of a ferromagnetic layer coming into contact with the tunnel barrier layer is in an amorphous state. According to Non-Patent Literature 1, a tunnel barrier layer is an MgO film and CoFeB films are formed over and under the MgO film as interfaces. That is, a "CoFeB/MgO/CoFeB" structure where an MgO film is interposed between two CoFeB films is formed. It is reported that the "CoFeB/MgO/CoFeB" structure contributes to the improvement of an MR ratio.

PREVIOUS TECHNICAL LITERATURE

Patent Literature

[Patent Literature 1]
Japanese Unexamined Patent Publication No. 2009-200123
[Patent Literature 2]
WO2009/001706
[Patent Literature 3]
Japanese Unexamined Patent Publication No. 2006-80116

Non-Patent Literature

[Non-Patent Literature 1]
Djayaprawira et al., "230% room-temperature magnetoresistance in CoFeB/MgO/CoFeB magnetic tunnel junctions", Applied Physics Letters, 86, 092502, 2005.

SUMMARY

The present inventors have found the following problems on a magnetoresistive effect element using a perpendicular magnetization film. A problem is that the perpendicular magnetic anisotropy of a data storage layer and a data reference layer occasionally deteriorates by high-temperature heat treatment in a later process. The deterioration of the perpendicular magnetic anisotropy of a data storage layer and a data reference layer leads to the deterioration of an MR ratio. It is desired to inhibit the deterioration of an MR ratio caused by a high-temperature heat treatment, in other words, to improve "heat resistance".

Other problems and novel features will be obvious through the descriptions and attached drawings in the specification.

In an embodiment, a magnetoresistive effect element includes a data storage layer, a data reference layer, and an MgO film interposed between the data storage layer and the data reference layer. The data storage layer includes a CoFeB film coming into contact with the MgO film, a perpendicular magnetization film, and a Ta film interposed between the CoFeB film and the perpendicular magnetization film. The CoFeB film is magnetically coupled to the perpendicular magnetization film through the Ta film.

In another embodiment, a magnetoresistive effect element includes a data storage layer, a data reference layer, and an MgO film interposed between the data storage layer and the data reference layer. The data reference layer includes a CoFeB film coming into contact with the MgO film, a perpendicular magnetization film, and a Ta film interposed between the CoFeB film and the perpendicular magnetization film. The CoFeB film is magnetically coupled to the perpendicular magnetization film through the Ta film.

In yet another embodiment, a magnetoresistive effect element includes a data storage layer, a data reference layer, and an MgO film interposed between the data storage layer and the data reference layer. The data storage layer includes a CoFeB film coming into contact with the MgO film and a perpendicular magnetization film magnetically coupled to the CoFeB film. The perpendicular magnetization film includes a Co/Pt/Co laminated structure.

According to an embodiment, the deterioration of an MR ratio caused by high-temperature heat treatment can be inhibited in a magnetoresistive effect element using a perpendicular magnetization film.

DETAILED DESCRIPTION

A magnetoresistive effect element and a magnetic memory according to an embodiment are explained in reference to the attached drawings.

1. Basic Configuration of Magnetoresistive Effect Element

Figure 1:
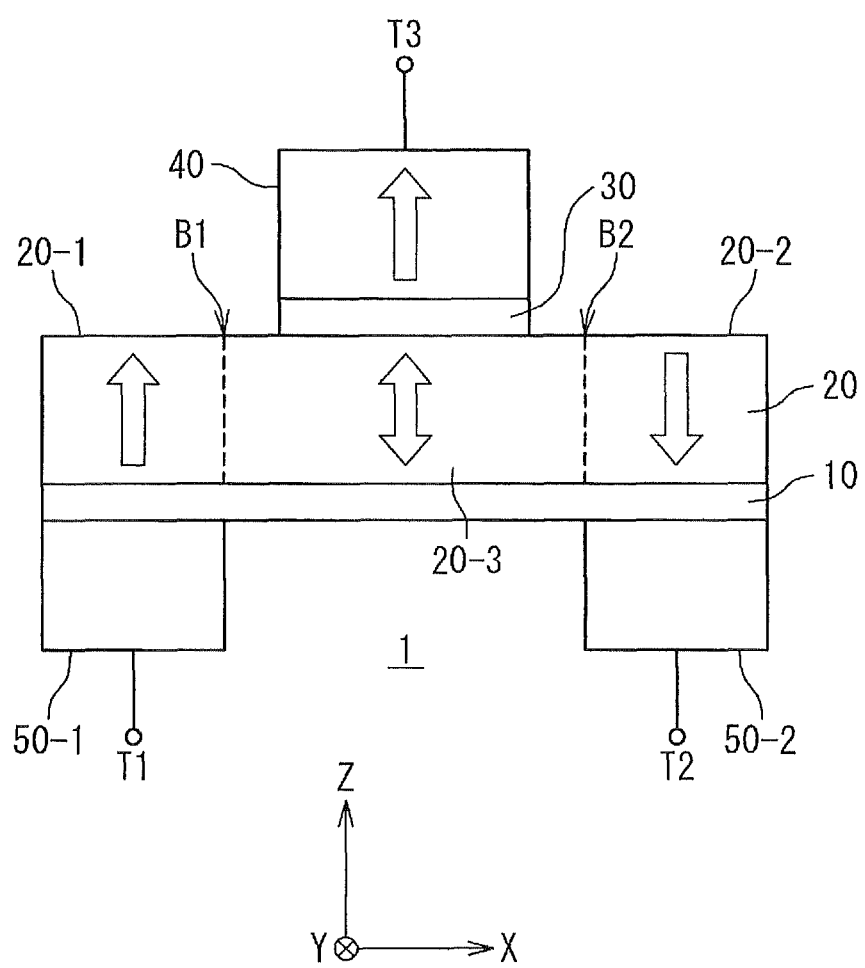
FIG. 1 schematically shows a configuration of a magnetoresistive effect element according to an embodiment.

FIG. 1 schematically shows a configuration of a magnetoresistive effect element 1 according to an embodiment. The magnetoresistive effect element 1 includes an underlayer 10, a data storage layer 20, a tunnel barrier layer 30, a data reference layer 40, a first pinning layer 50-1, a second pinning layer 50-2, a first terminal T1, a second terminal T2, and a third terminal T3. Here, in the explanation hereunder, the layer stacking direction is the Z direction and the plane perpendicular to the Z direction is the XY plane. The magnetization direction of a perpendicular magnetization film is generally perpendicular to a plane over which the film is formed. That is, the magnetization direction is +Z or −Z direction.

The data storage layer 20 is formed over the underlayer 10. Further, the data storage layer 20 includes a perpendicular magnetization film having perpendicular magnetic anisotropy. Here, the data storage layer 20 however may include a non-magnetic film as it will be described later.

In the present embodiment, a magnetoresistive effect element 1 of a domain wall displacement type is explained as an example. In the case of a domain wall displacement type, as shown in FIG. 1, a data storage layer 20 has a first magnetization fixed region 20-1, a second magnetization fixed region 20-2, and a magnetization free region 20-3.

The first magnetization fixed region 20-1 is a region magnetically coupled to a first pinning layer 50-1. The first pinning layer 50-1 is a perpendicular magnetization film with a fixed magnetization direction and the magnetization direction of the first magnetization fixed region 20-1 is also fixed in one direction by the magnetic coupling to the first pinning layer 50-1. In the example of FIG. 1, the first pinning layer 50-1 and the first magnetization fixed region 20-1 are formed so as to interpose an underlayer 10.

The second magnetization fixed region 20-2 is a region magnetically coupled to a second pinning layer 50-2. The second pinning layer 50-2 is a perpendicular magnetization film with a fixed magnetization direction and the magnetization direction of the second magnetization fixed region 20-2 is also fixed in one direction by the magnetic coupling to the second pinning layer 50-2. In the example of FIG. 1, the second pinning layer 50-2 and the second magnetization fixed region 20-2 are formed so as to interpose the underlayer 10.

Further, the magnetization directions of the first magnetization fixed region 20-1 and the second magnetization fixed region 20-2 are fixed in the opposite directions from each other. In the example of FIG. 1, the magnetization direction of the first magnetization fixed region 20-1 is fixed in the +Z direction and the magnetization direction of the second magnetization fixed region 20-2 is fixed in the −Z direction.

On the other hand, the magnetization direction of the magnetization free region 20-3 is invertible and is allowed to be directed to the +Z direction or the −Z direction. The magnetization free region 20-3 is interposed between the first magnetization fixed region 20-1 and the second magnetization fixed region 20-2 in a direction parallel to the plane. The boundary between the first magnetization fixed region 20-1 and the magnetization free region 20-3 is a first boundary B1 and the boundary between the second magnetization fixed region 20-2 and the magnetization free region 20-3 is a second boundary B2.

A data reference layer 40 is formed over the magnetization free region 20-3 in the data storage layer 20 through a tunnel barrier layer 30. The data reference layer 40 includes a perpendicular magnetization film having perpendicular magnetic anisotropy and has a magnetization direction fixed in one direction. In FIG. 1 for example, the magnetization direction of the data reference layer 40 is fixed in the +Z direction. Here, the data reference layer 40 however may include a non-magnetic film as it will be described later.

The tunnel barrier layer 30 is a non-magnetic layer and typically a thin insulation film. The tunnel barrier layer 30 is interposed between the magnetization free region 20-3 in the data storage layer 20 and the data reference layer 40 and a magnetic tunnel junction (MTJ) is formed with the data storage layer 20 (the magnetization free region 20-3), the tunnel barrier layer 30, and the data reference layer 40.

A first terminal T1 and a second terminal T2 are disposed so as to be able to make electric current flow into the data storage layer 20. In the example of FIG. 1, the first terminal T1 is electrically coupled to the first pinning layer 50-1 and the second terminal T2 is electrically coupled to the second pinning layer 50-2. Further, a third terminal T3 is electrically coupled to the data reference layer 40.

Figure 2:
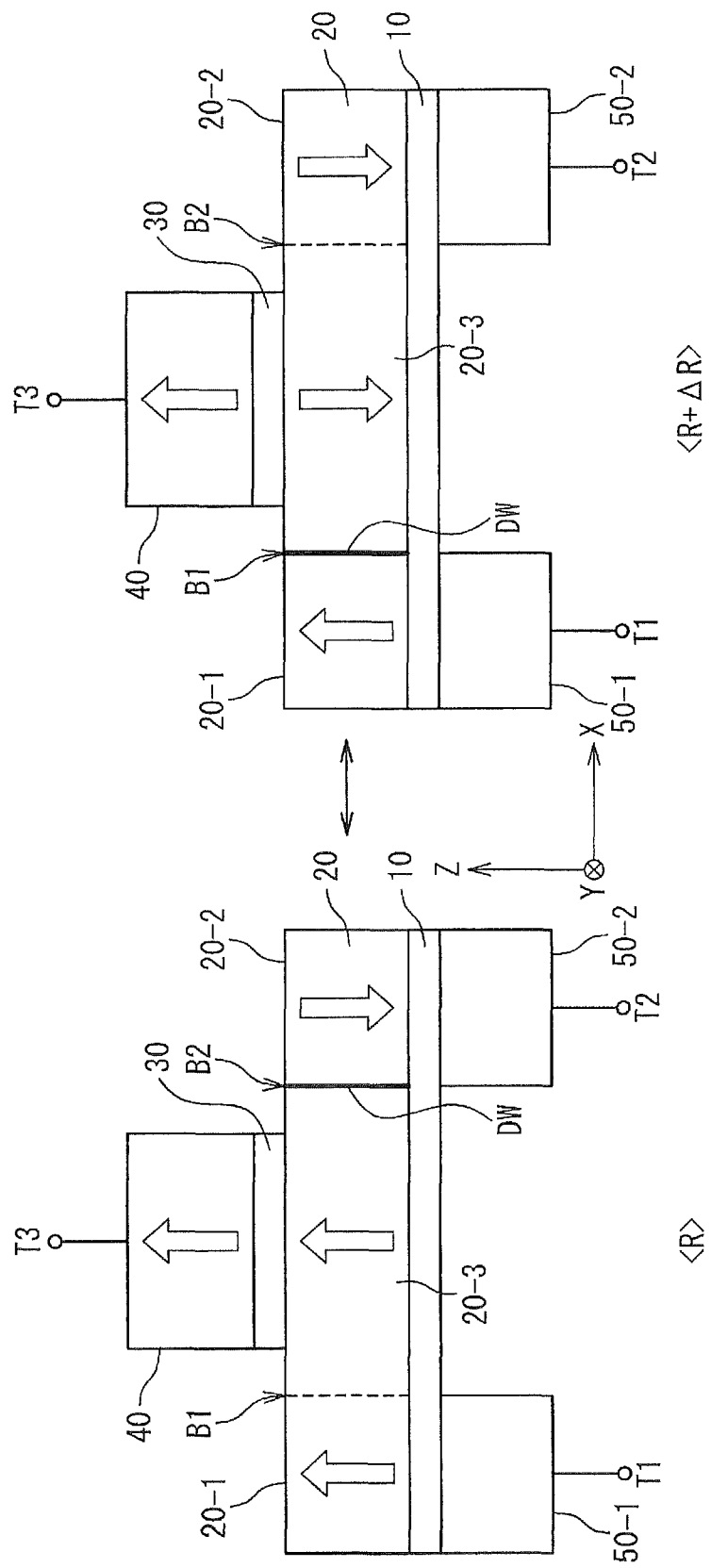
FIG. 2 shows two magnetic states which the magnetoresistive effect element shown in FIG. 1 can take.

FIG. 2 shows two magnetic states which the magnetoresistive effect element 1 shown in FIG. 1 can take. In the first state, the magnetization of the magnetization free region 20-3 in the data storage layer 20 is directed in the +Z direction. In this case, the first magnetization fixed region 20-1 and the magnetization free region 20-3 form a magnetic domain and the second magnetization fixed region 20-2 forms another magnetic domain. Consequently, a domain wall DW is formed at the second boundary B2 between the second magnetization fixed region 20-2 and the magnetization free region 20-3. Further, the resistance value (R) of the MTJ comes to be comparatively low because the magnetization direction of the magnetization free region 20-3 is parallel to the magnetization direction of the data reference layer 40. The low resistance state corresponds to the data "0" for example.

In the second state, the magnetization of the magnetization free region 20-3 in the data storage layer 20 is directed in the −Z direction. In this case, the second magnetization fixed region 20-2 and the magnetization free region 20-3 form a magnetic domain and the first magnetization fixed region 20-1 forms another magnetic domain. Consequently, a domain wall DW is formed at the first boundary B1 between the first magnetization fixed region 20-1 and the magnetization free region 20-3. Further, the resistance value of the MTJ comes to be comparatively high because the magnetization direction of the magnetization free region 20-3 is non-parallel to the magnetization direction of the data reference layer 40. The high resistance state corresponds to the data "1" for example.

As explained above, the resistance value of the MTJ changes in accordance with the magnetization direction of the magnetization free region 20-3 in the data storage layer 20. By using the change of the resistance value, it is possible to memorize the data "0" and "1" in a non-volatile manner. Meanwhile, a domain wall DW is formed at the first boundary B1 or at the second boundary B2 in accordance with the magnetization direction of the magnetization free region 20-3. That is, it can also be said that the location of the domain wall DW in the data storage layer 20 reflects stored data.

Figure 3:
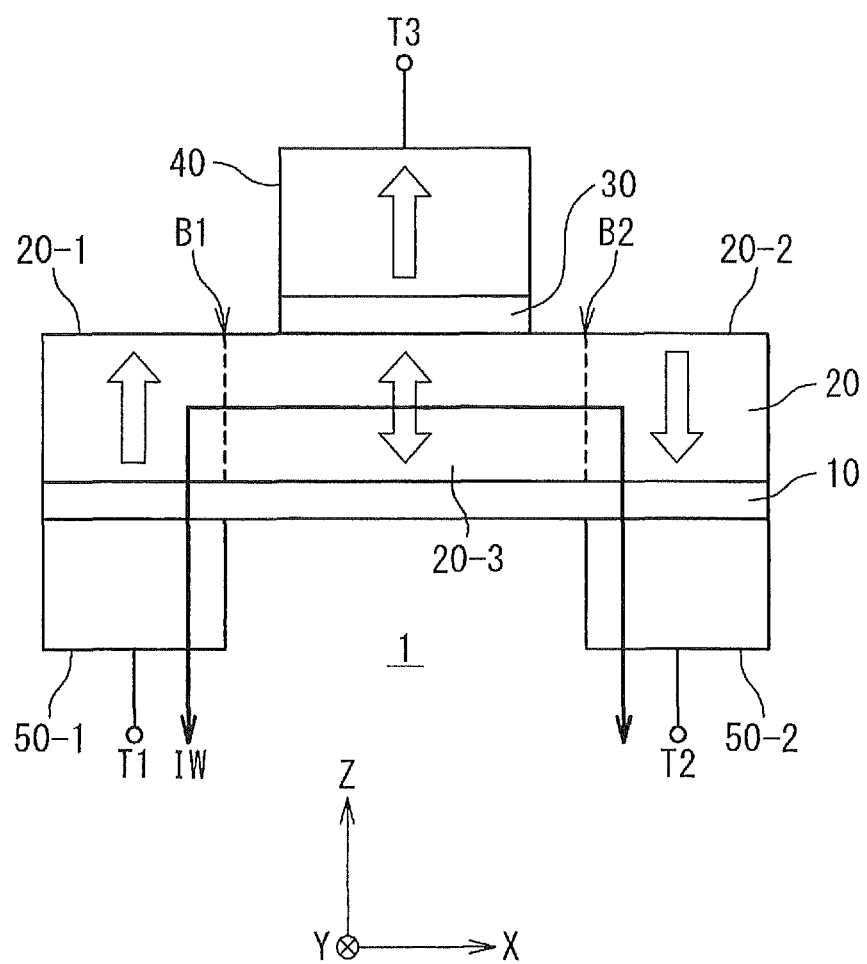
FIG. 3 is a conceptual view for explaining the writing of data in the magnetoresistive effect element shown in FIG. 1.

Data are written by displacing the domain wall DW between the first boundary B1 and the second boundary B2. Such magnetic domain displacement may be materialized by making a writing current IW flow in the data storage layer 20 so that the current may pass through the domain wall DW. Specifically, as shown in FIG. 3, a prescribed potential difference is applied between the first terminal T1 and the second terminal T2 so that a writing current IW may flow between the first terminal T1 and the second terminal T2 through the data storage layer 20.

When data is rewritten from "0" to "1", a writing current IW flows from the first terminal T1 into the second terminal T2 through the data storage layer 20. On this occasion, in the data storage layer 20, electrons flow from the second magnetization fixed region 20-2 into the magnetization free region 20-3 through the second boundary B2. That is, spin electrons of the −Z direction are injected from the second magnetization fixed region 20-2 into the magnetization free region 20-3. As a result of the spin transfer by the spin electrons, the magnetization of the magnetization free region 20-3 starts to invert the direction into the −Z direction gradually from the vicinity of the second boundary B2. This means that the domain wall DW moves from the second boundary B2 toward the first boundary B1. When the writing current IW continues to flow, the domain wall DW passes through the magnetization free region 20-3 and reaches the first boundary B1. The domain wall DW stops at the first boundary B1 by pinning potential.

When data is rewritten from "1" to "0" on the other hand, a writing current IW flows from the second terminal T2 into the first terminal T1 through the data storage layer 20. On this occasion, in the data storage layer 20, electrons flow from the first magnetization fixed region 20-1 into the magnetization free region 20-3 through the first boundary B1. That is, spin electrons of the +Z direction are injected from the first magnetization fixed region 20-1 into the magnetization free region 20-3. As a result of the spin transfer by the spin electrons, the magnetization of the magnetization free region 20-3 starts to invert the direction into the +Z direction gradually from the vicinity of the first boundary B1. This means that the domain wall DW moves from the first boundary B1 toward the second boundary B2. When the writing current IW continues to flow, the domain wall DW passes through the magnetization free region 20-3 and reaches the second boundary B2. The domain wall DW stops at the second boundary B2 by pinning potential.

In this way, the first magnetization fixed region 20-1 and the second magnetization fixed region 20-2 having inversely fixed magnetization play the role of a supply source of electrons having different spins. Then the domain wall DW in the data storage layer 20 moves between the first boundary B1 and the second boundary B2 by the writing current IW flowing between the first magnetization fixed region 20-1 and the second magnetization fixed region 20-2. As a result, the magnetization direction of the magnetization free region 20-3 switches. That is, data rewriting using current-driven domain wall displacement is materialized. Since the writing current IW does not pass through the tunnel barrier layer 30, the tunnel barrier layer 30 is inhibited from deteriorating.

Figure 4:
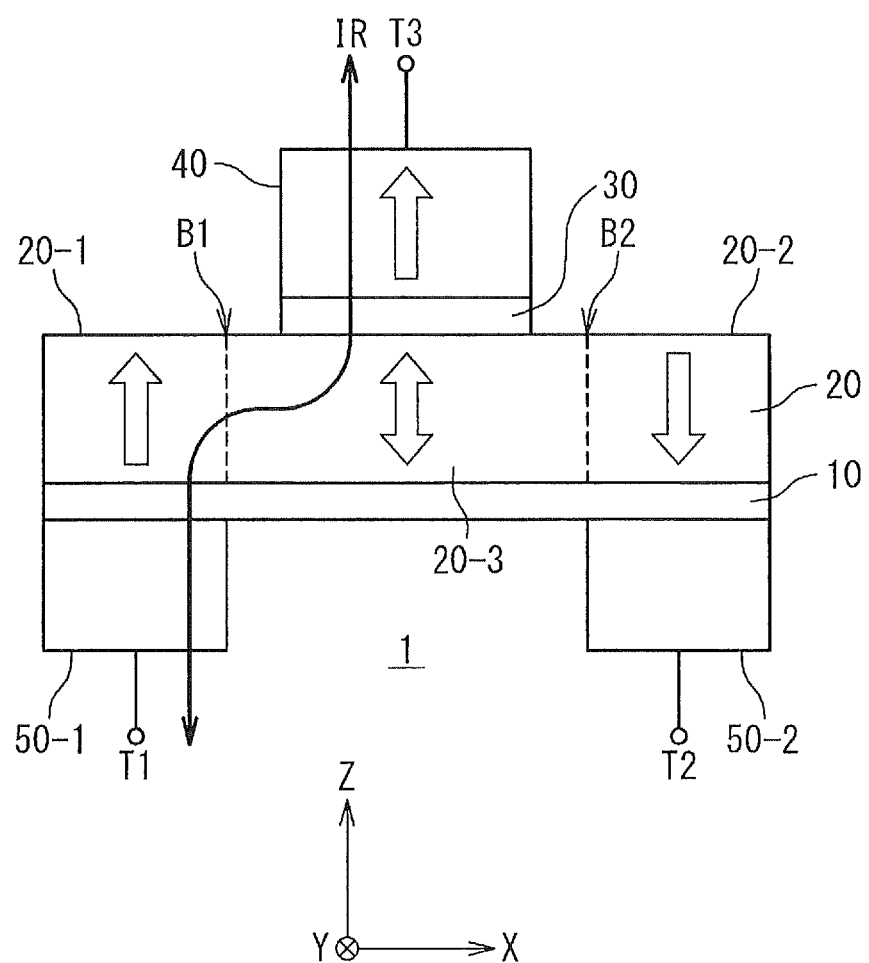
FIG. 4 is a conceptual view for explaining the reading of data from the magnetoresistive effect element shown in FIG. 1.

Data reading operations are as follows. When data are read, a readout current IR is supplied so as to flow between the data reference layer 40 and the magnetization free region 20-3 through the tunnel barrier layer 30. For that purpose, as shown in FIG. 4 for example, a prescribed potential difference is applied between the first terminal T1 and the third terminal T3 so that the readout current IR may flow between the first terminal T1 and the third terminal T3. The magnitude (R or R+ΔR) of the resistance value of an MTJ is detected by comparing a readout current IR or a readout potential corresponding to the readout current IR with a prescribed reference level. That is, the magnetization direction (+Z direction or −Z direction) of the magnetization free region 20-3 is sensed and the stored data ("0" or "1") is sensed.

When data are read out, it is desirable that an MR ratio (ΔR/R) is as high as possible in order to judge the stored data accurately and quickly. That is, a high MR ratio is indispensable in order to materialize a good readout property. In the present embodiment, a film configuration capable of improving an MR ratio is proposed. The film configuration according to the present embodiment is hereunder explained in detail.

2. Film Configuration

Figure 5:
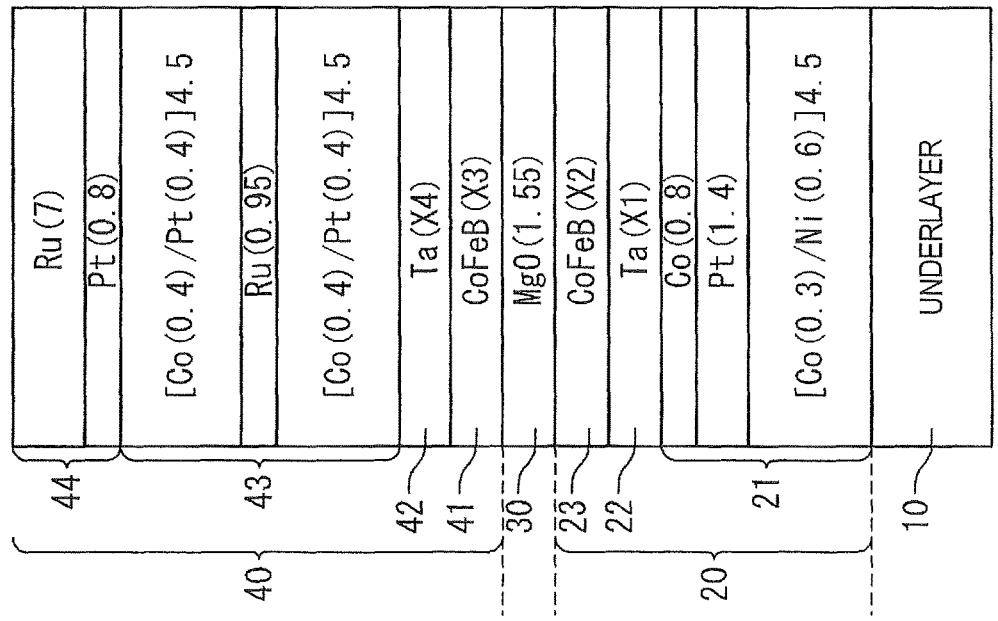
FIG. 5 shows a film configuration of the magnetoresistive effect element according to an embodiment.

FIG. 5 shows a film configuration of a magnetoresistive effect element 1 according to the present embodiment. Here, a numeral in a parenthesis in FIG. 5 represents an example of the thickness of a film.

Firstly in the present embodiment, an MgO film is used as a tunnel barrier layer 30.

A data storage layer 20 includes a perpendicular magnetization film 21, a Ta film 22, and a CoFeB film 23. In the example of FIG. 5, the perpendicular magnetization film 21, the Ta film 22, and the CoFeB film 23 are stacked over an underlayer 10 in this order. That is, the perpendicular magnetization film 21 is formed over the underlayer 10, the Ta film 22 is formed over the perpendicular magnetization film 21, and the CoFeB film 23 is formed over the Ta film 22. Further, the CoFeB film 23 comes into contact with the MgO film 30.

The Ta film 22 is interposed between the perpendicular magnetization film 21 and the CoFeB film 23. The perpendicular magnetization film 21 and the CoFeB film 23 are magnetically coupled to each other through the non-magnetic Ta film 22. By the magnetic coupling, the CoFeB film 23 also has a perpendicular magnetization property. Since the CoFeB film 23 having such a property is formed so as to come into contact with the MgO film 30, a high MR ratio is expected (refer to Non-Patent Literature 1).

The perpendicular magnetization film 21 in the data storage layer 20 includes a Co/Ni laminated film. In the example shown in FIG. 5, the perpendicular magnetization film 21 includes [Co/Ni] 4.5=Co/Ni/Co/Ni/Co/Ni/Co/Ni/Co. Such a Co/Ni laminated film exhibits perpendicular magnetic anisotropy. Further, in the present embodiment, a Pt film and a Co film are stacked in this order over the Co film as the uppermost layer of the perpendicular magnetization film 21. That is, the perpendicular magnetization film 21 has a laminated structure of "Co/Pt/Co" where the Pt film is interposed between the two Co films. The upper Co film in the "Co/Pt/Co" structure comes into contact with the Ta film 22 stated above.

A data reference layer 40 includes a CoFeB film 41, a Ta film 42, a perpendicular magnetization film 43, and a cap film 44. In the example of FIG. 5, the CoFeB film 41, the Ta film 42, the perpendicular magnetization film 43, and the cap film 44 are stacked over the MgO film 30 in this order. That is, the CoFeB film 41 is formed over the MgO film 30 so as to come into contact with the MgO film 30. Further, the Ta film 42 is formed over the CoFeB film 41, the perpendicular magnetization film 43 is formed over the Ta film 42, and the cap film 44 is formed over the perpendicular magnetization film 43.

The Ta film 42 is interposed between the perpendicular magnetization film 43 and the CoFeB film 41. The perpendicular magnetization film 43 and the CoFeB film 41 are magnetically coupled to each other through the non-magnetic Ta film 42. By the magnetic coupling, the CoFeB film 41 also has a perpendicular magnetization property. Since the CoFeB film 41 having such a property is formed so as to come into contact with the MgO film 30, a high MR ratio is expected (refer to Non-Patent Literature 1).

The perpendicular magnetization film 43 in the data reference layer 40 includes two Co/Pt laminated films and a Ru film interposed between them. The two Co/Pt laminated films are magnetically coupled to each other through the non-magnetic Ru film. By such a structure (called a synthetic ferrimagnetic structure), the perpendicular magnetization direction of the data reference layer 40 is firmly fixed. The cap film 44 includes a Pt film and a Ru film.

3. Effects

As described above, since the CoFeB films (23 and 41) are formed so as to come into contact with the MgO film 30 as the tunnel barrier layer, a high MR ratio is expected (refer to Non-Patent Literature 1). In the present embodiment however, effects that cannot be obtained merely by the fact that the CoFeB films come into contact with the MgO film 30 are obtained. Such a comparative example as shown in FIG. 6 is considered in order to explain the effects peculiar to the present embodiment.

Figure 6:
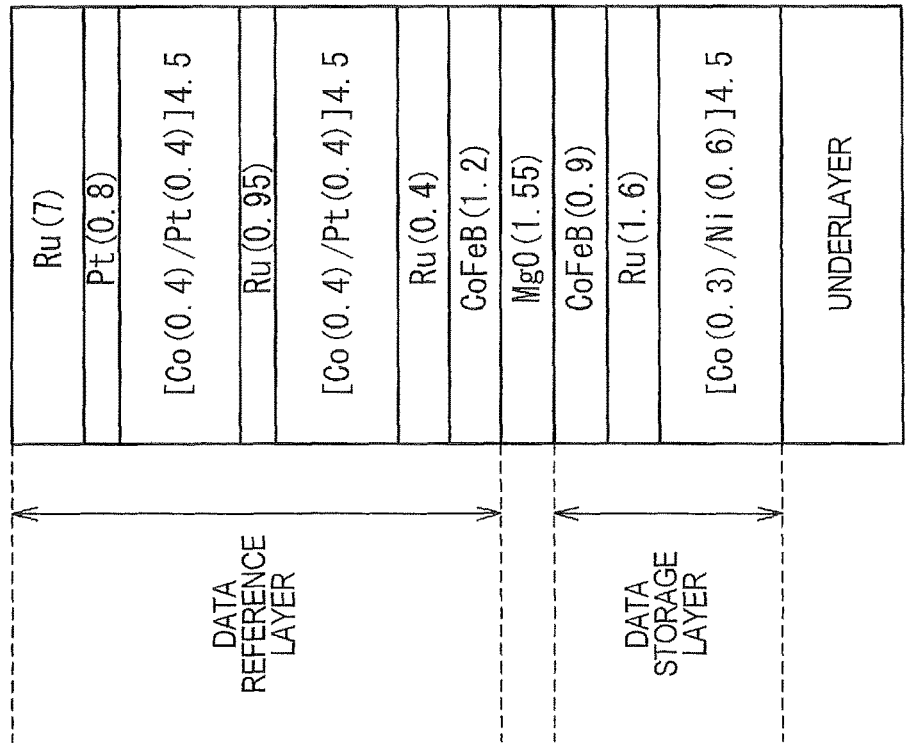
FIG. 6 shows a film configuration of a magnetoresistive effect element according to a comparative example.

In the comparative example shown in FIG. 6, CoFeB films are formed over and under an MgO film which is a tunnel barrier layer in the same way as the present embodiment. In a data storage layer however, not a Ta film but a Ru film is interposed between a CoFeB film and a perpendicular magnetization film (Co/Ni laminated film). Further, in a data reference layer, not a Ta film but a Ru film is interposed between a CoFeB film and a perpendicular magnetization film (Co/Pt synthetic ferrimagnetic film). Furthermore, the perpendicular magnetization film in the data storage layer does not include a "Co/Pt/Co" structure unlike the present embodiment.

Figures 7, 8:
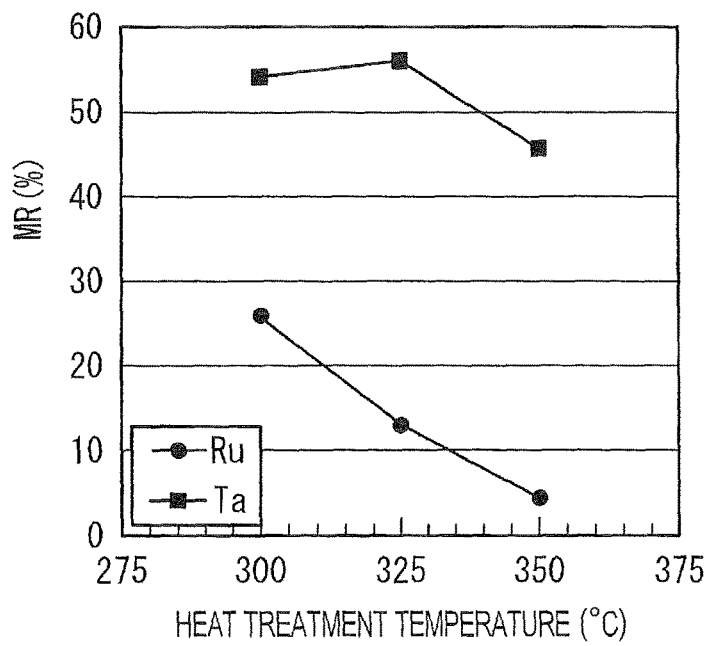
FIG. 7 is a graph showing comparative results of MR ratios between the present embodiment and the comparative example.
FIG. 8 shows the results of test for comparing "adhesiveness" between the present embodiment and the comparative example.

In a comparative experiment, laminated film structures of the present embodiment (FIG. 5) and the comparative example (FIG. 6) are produced. After a high-temperature heat treatment is applied, MR ratios are measured. FIG. 7 shows the results of comparing the MR ratios between the present embodiment and the comparative example. The vertical axis represents a measured MR ratio and the horizontal axis represents a heat treatment temperature.

As it is obvious from FIG. 7, a higher MR ratio is obtained in the case of the present embodiment using Ta than in the case of the comparative example using Ru. In the comparative example in particular, it is obvious that the MR ratios deteriorate significantly as the heat treatment temperature rises. In the case of the present embodiment in contrast, high MR ratios are maintained even though the heat treatment temperature rises. That is, in the present embodiment, the MR ratios are inhibited from deteriorating even after high-temperature heat treatment is applied and an excellent heat resistance is obtained. As it is obvious from the comparative experiment, the effects of the present embodiment are not obtained merely by the fact that the CoFeB films come into contact with the MgO film 30. A film configuration in the present embodiment is variously discussed hereunder.

4. Discussion

4-1. With Regard to Significance of Ta

Firstly, one of the features of the present embodiment is that the CoFeB films (23 and 41) are magnetically couple to the perpendicular magnetization films (21 and 43) through the Ta films (22 and 42) in the data storage layer 20 and the data reference layer 40. As technological significance of the Ta films, at least the following two subjects can be considered.

(1) Adhesiveness

FIG. 8 shows the results of the test for comparing the "adhesiveness" between the present embodiment and a comparative example. Specifically, peeling test is applied to each of the one hundred samples in each of the case where the inserted film type is Ta (the present embodiment) and the case where the inserted film type is Ru (comparative example). FIG. 8 shows the number of the samples showing exfoliation in one hundred samples each. Showing exfoliation means that the adhesiveness is poor.

As it is obvious from FIG. 8, in the case of the comparative example (Ru), exfoliation occurs by high-temperature heat treatment. In particular, the frequency of the exfoliation increases as the heat treatment temperature rises. That is, it is obvious that the adhesiveness of Ru is poor and the tendency becomes more conspicuous as the heat treatment temperature rises. If local exfoliation occurs at an interface between a Ru film and a CoFeB film as a result of high-temperature heat treatment, that causes an MR ratio to deteriorate. Further, if a Ru film is completely separated from a CoFeB film, the original function as a device is lost. Furthermore, poor adhesiveness means also that magnetic coupling between a CoFeB film and a perpendicular magnetization film through a Ru film is weak. It is estimated that the deterioration of an MR ratio caused by high-temperature heat treatment as shown in FIG. 7 appears by such factors.

In the case of the present embodiment (Ta) in contrast, exfoliation does not occur regardless of heat treatment temperature. That is, it is obvious that the adhesiveness of Ta is very good. Since exfoliation between a Ta film and a CoFeB film does not occur even after high-temperature heat treatment, a high MR ratio is maintained. Further, good adhesiveness means that magnetic coupling between a CoFeB film and a perpendicular magnetization film through a Ta film is firmly maintained. This also contributes to a high MR ratio.

(2) Crystal Control

As a result of heat treatment, the crystalline structure of a CoFeB film is expected to take a bcc structure (body-centered cubic lattice structure) by the influence of an adjacent MgO film. It is known that it is important for realizing a high MR ratio that the crystalline structures of a CoFeB film and an MgO film take bcc structures (refer to Non-patent Literature 1 and others).

Here, in order to simplify a laminated structure, it is also considered to directly stack a perpendicular magnetization film (21 or 43) and a CoFeB film (23 or 41) without interposing a Ta film (22 or 42). The crystalline structure of a perpendicular magnetization film (21 or 43) in the present embodiment however is an fcc structure (face-centered cubic lattice structure). When a CoFeB film directly comes into contact with a perpendicular magnetization film of such an fcc structure, the crystalline structure of the CoFeB film is hindered from being transformed into a bcc structure. Consequently, an MgO film 30 can hardly take a bcc structure too. As a result, a high MR ratio that has been originally expected cannot be realized.

In the present embodiment in contrast, a Ta film (22 or 42) exists between a perpendicular magnetization film (21 or 43) and a CoFeB film (23 or 41). Since a very thin Ta film grows amorphously, it does not affect the crystalline orientation of a CoFeB film. In other words, a Ta film plays the role of inhibiting the fcc crystalline orientation of a perpendicular magnetization film from propagating into a CoFeB film. As a result, a CoFeB film and an MgO film having been subjected to high-temperature heat treatment can take good bcc structures. Consequently, a high MR ratio that has been originally expected can be realized.

4-2. With Regard to Co/Pt/Co Structure

Another feature of the present embodiment is that a perpendicular magnetization film 21 in a data storage layer 20 has a laminated structure called "Co/Pt/Co" formed by interposing a Pt film between two Co films. The present inventors have found that such a Co/Pt/Co structure enhances the perpendicular magnetic anisotropy of a perpendicular magnetization film 21. Since the perpendicular magnetic anisotropy of a perpendicular magnetization film 21 itself is enhanced, the perpendicular magnetic anisotropy of a CoFeB film 23 magnetically coupled to the perpendicular magnetization film 21 is also enhanced. This leads to the improvement of heat resistance and an MR ratio. The fact that a Co/Pt/Co structure enhances the perpendicular magnetic anisotropy of a perpendicular magnetization film 21 is verified hereunder.

Figure 9:
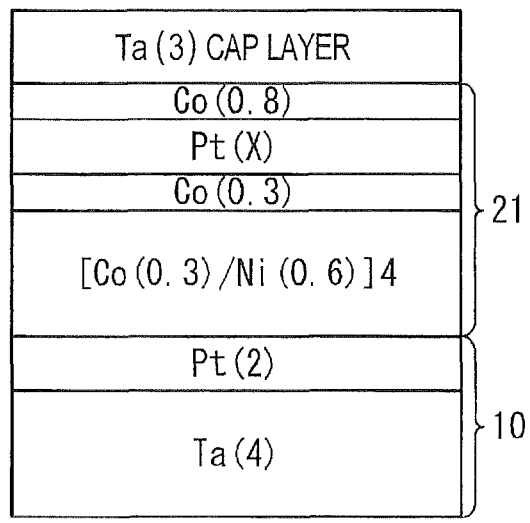
FIG. 9 shows a configuration of a sample used for evaluating a Co/Pt/Co structure.

FIG. 9 shows the configuration of a sample used for evaluating a Co/Pt/Co structure. In the sample, a perpendicular magnetization film 21 including a Co/Pt/Co structure is formed over an underlayer 10 (Ta/Pt) and a Ta film is formed further thereon as a cap layer. Here, a plurality of samples having Pt films the thicknesses of which are variously changed are prepared and the perpendicular magnetic anisotropy of each of the samples is measured. Here, the perpendicular magnetic anisotropy can be measured by investigating a saturation magnetization Hs by VSM.

Figure 10:
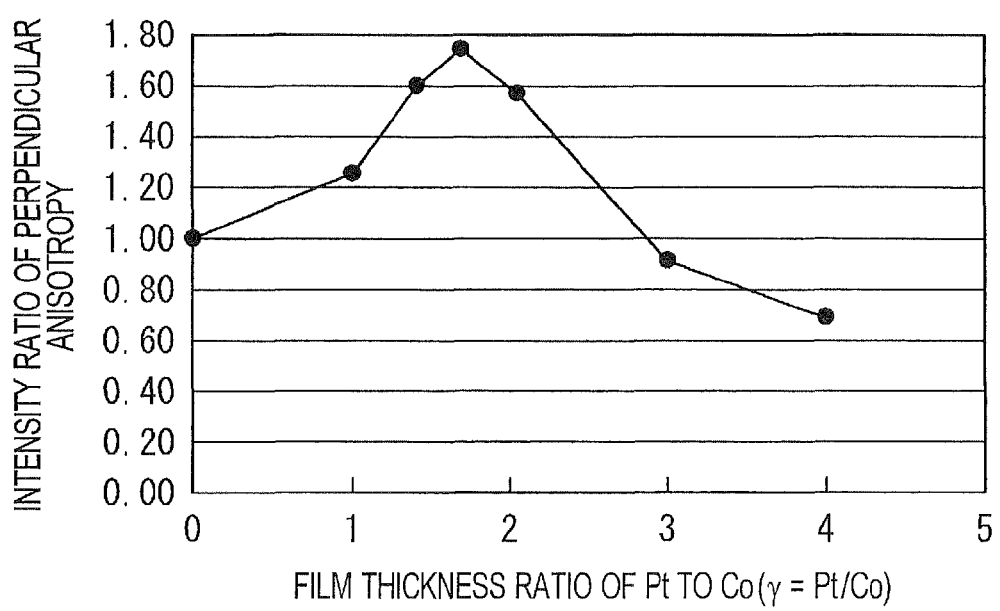
FIG. 10 is a graph showing the effects of Co/Pt/Co structures.

FIG. 10 shows the measurement results of the perpendicular magnetic anisotropy. The horizontal axis represents a ratio $\gamma$ (=Pt film thickness/Co film thickness) of a Pt film thickness to a Co film thickness (=0.3 nm). $\gamma=0$ means a case where a Pt film is not inserted, namely a case of a simple Co film in which a Co/Pt/Co structure is not formed. The vertical axis represents a perpendicular magnetic anisotropy standardized with a value in the case of $\gamma=0$. As it is obvious from FIG. 10, the perpendicular magnetic anisotropy is enhanced more in the case where a Co/Pt/Co structure is formed than in the case of $\gamma=0$. It is estimated that interface magnetic anisotropy generated at a Co/Pt interface contributes to the enhancement of the perpendicular magnetic anisotropy.

The perpendicular magnetic anisotropy comes to be strongest when $\gamma$ is in the vicinity of 2. If $\gamma$ is excessively large, the perpendicular magnetic anisotropy is not necessarily enhanced. This is presumably because a nonmagnetic Pt part relatively increases and the perpendicular magnetic anisotropy of a whole laminated structure weakens.

A CoFeB film 23 is an in-plane magnetization film by nature but comes to have perpendicular magnetization by magnetically coupling to a perpendicular magnetization film 21. The perpendicular magnetic anisotropy of a Co/Ni laminated film included in a perpendicular magnetization film 21 however tends to lower by high-temperature heat treatment. If the perpendicular magnetic anisotropy of a perpendicular magnetization film 21 weakens, the perpendicular component of the magnetization of a CoFeB film 23 magnetically coupled to the perpendicular magnetization film 21 weakens and the in-plane component strengthens. This causes an MR ratio to deteriorate. In the case of the comparative example shown in FIG. 6, it is estimated that such deterioration of an MR ratio appears conspicuously because a perpendicular magnetization film includes only a Co/Ni laminated film. In the present embodiment in contrast, a perpendicular magnetization film 21 includes a Co/Pt/Co structure and hence the perpendicular magnetic anisotropy of the perpendicular magnetization film 21 is enhanced. Consequently, the perpendicular magnetization of a CoFeB film 23 magnetically coupled to the perpendicular magnetization film 21 is also maintained in an enhanced state and resultantly a high MR ratio and a high degree of heat resistance are materialized.

4-3. With Regard to Film Thickness

Figure 11:
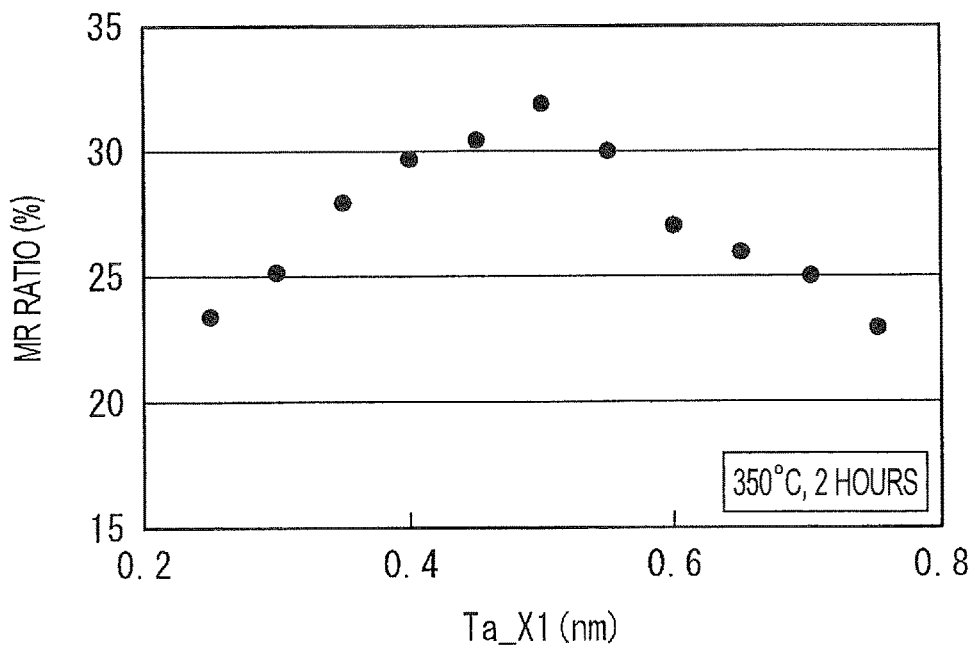
FIG. 11 is a graph showing the dependency of an MR ratio on a Ta film thickness (X1).

FIG. 11 is a graph showing the dependency of an MR ratio on the film thickness X1 of a Ta film 22. Here, the film thickness X2 of a CoFeB film 23, the film thickness X3 of a CoFeB film 41, and the film thickness X4 of a Ta film 42 are set at X2=0.85 nm, X3=1.4 nm, and X4=0.45 nm, respectively. The conditions of the heat treatment are 350° C. and 2 hours.

An MR ratio takes the maximum value when the film thickness X1 of a Ta film 22 is in the vicinity of 0.5 nm. The reason why the MR ratio lowers as the film thickness X1 reduces is presumably that a Ta film 22 comes to be not able to sufficiently inhibit the fcc crystalline orientation of a perpendicular magnetization film 21 from propagating to a CoFeB film 23. In contrast, the reason why the MR ratio lowers as the film thickness X1 increases is presumably that magnetic coupling between a perpendicular magnetization film 21 and a CoFeB film 23 through a Ta film 22 weakens. The preferable range of the film thickness X1 allowing an MR ratio of 25% or more is 0.3 to 0.7 nm.

Figure 12:
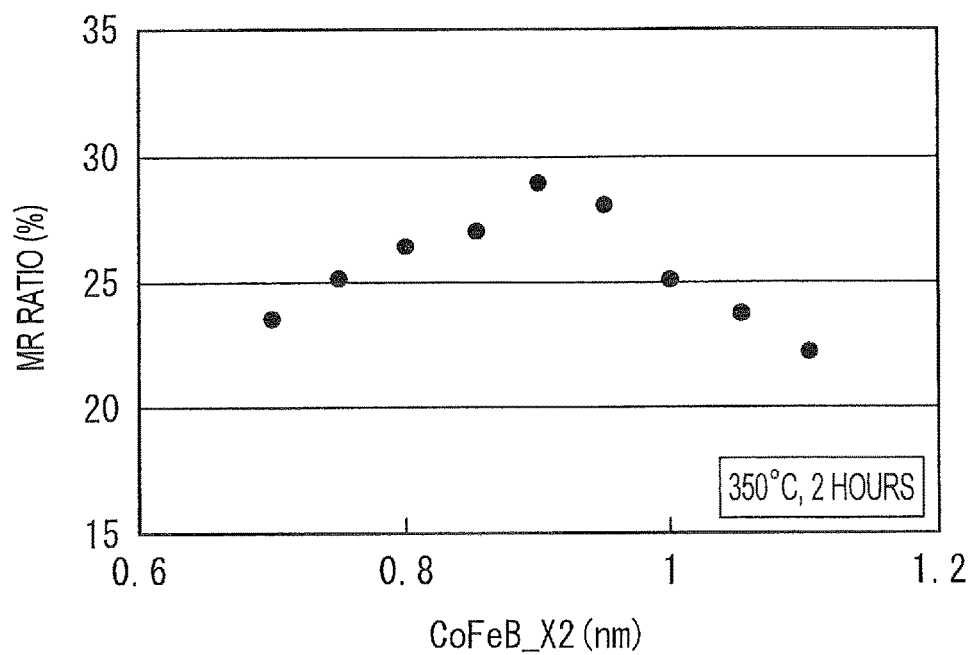
FIG. 12 is a graph showing the dependency of an MR ratio on a CoFeB film thickness (X2).

FIG. 12 is a graph showing the dependency of an MR ratio on the film thickness X2 of a CoFeB film 23. Here, the film thickness X1 of a Ta film 21, the film thickness X3 of a CoFeB film 41, and the film thickness X4 of a Ta film 42 are set at X1=0.6 nm, X3=1.4 nm, and X4=0.45 nm, respectively. The conditions of the heat treatment are 350° C. and 2 hours.

An MR ratio takes the maximum value when the film thickness X2 of a CoFeB film 23 is in the vicinity of 0.9 nm. The reason why the MR ratio lowers as the film thickness X2 reduces is presumably that the CoFeB film 23 after high-temperature heat treatment can hardly take a preferable bcc crystalline orientation. In contrast, the reason why the MR ratio lowers as the film thickness X2 increases is presumably that a perpendicular magnetization film 21 can hardly influence the whole of the CoFeB film 23 that is an in-plane magnetization film by nature and an intrinsic in-plane magnetization component appears in the CoFeB film 23. The preferable range of the film thickness X2 allowing an MR ratio of 250 or more is 0.75 to 1.0 nm.

Figure 13:
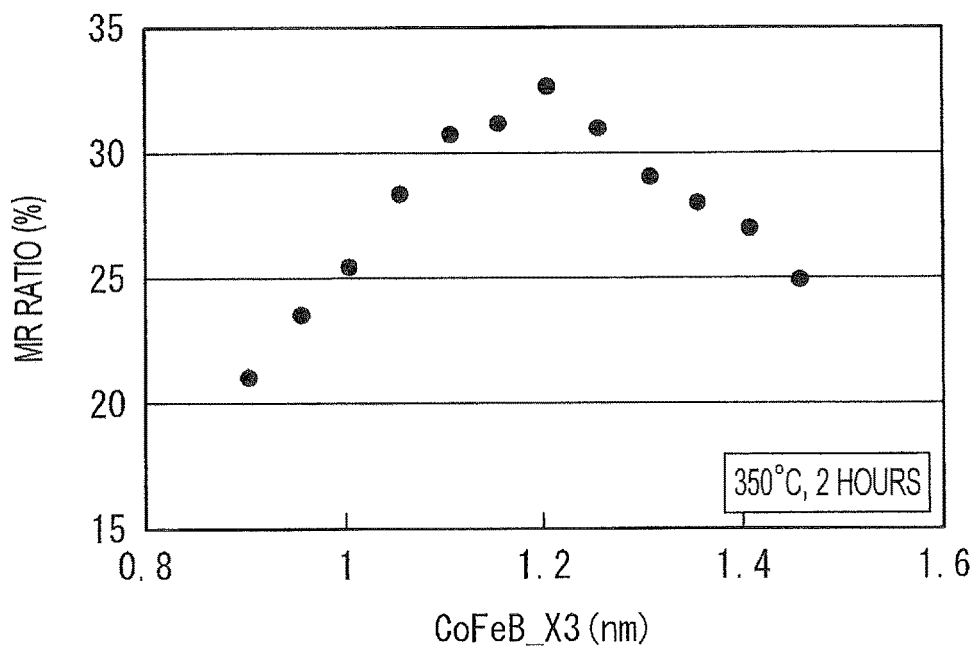
FIG. 13 is a graph showing the dependency of an MR ratio on a CoFeB film thickness (X3).

FIG. 13 is a graph showing the dependency of an MR ratio on the film thickness X3 of a CoFeB film 41. Here, the film thickness X1 of a Ta film 21, the film thickness X2 of a CoFeB film 23, and the film thickness X4 of a Ta film 42 are set at X1=0.6 nm, X2=0.85 nm, and X4=0.45 nm, respectively. The conditions of the heat treatment are 350° C. and 2 hours.

An MR ratio takes the maximum value when the film thickness X3 of a CoFeB film 41 is in the vicinity of 1.2 nm. The reason why the MR ratio lowers as the film thickness X3 reduces is presumably that the CoFeB film 41 after high-temperature heat treatment can hardly take a preferable bcc crystalline orientation. In contrast, the reason why the MR ratio lowers as the film thickness X3 increases is presumably that a perpendicular magnetization film 43 can hardly influence the whole of the CoFeB film 41 that is an in-plane magnetization film by nature and an intrinsic in-plane magnetization component appears in the CoFeB film 41. The preferable range of the film thickness X3 allowing an MR ratio of 25% or more is 1.0 to 1.4 nm.

Figure 14:
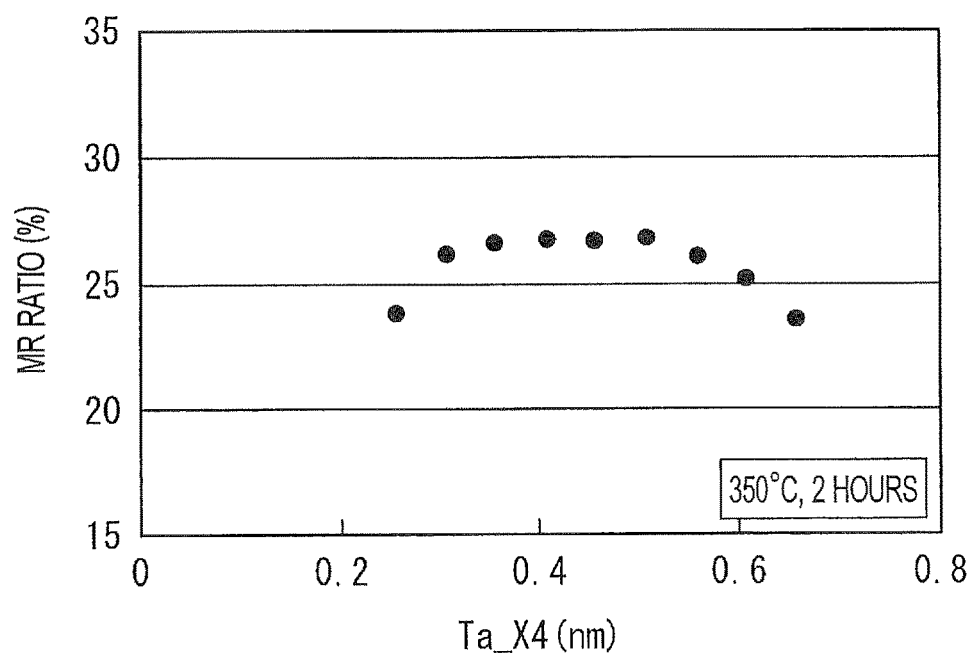
FIG. 14 is a graph showing the dependency of an MR ratio on a Ta film thickness (X4).

FIG. 14 is a graph showing the dependency of an MR ratio on the film thickness X4 of a Ta film 42. Here, the film thickness X1 of a Ta film 22, the film thickness X2 of a CoFeB film 23, and the film thickness X3 of a CoFeB film 41 are set at X1=0.6 nm, X2=0.85 nm, and X3=1.4 nm, respectively. The conditions of the heat treatment are 350° C. and 2 hours.

An MR ratio takes the maximum value when the film thickness X4 of a Ta film 42 is in the vicinity of 0.4 nm. The reason why the MR ratio lowers as the film thickness X4 reduces is presumably that a Ta film 42 comes to be not able to sufficiently inhibit the fcc crystalline orientation of a perpendicular magnetization film 43 from propagating to a CoFeB film 41. In contrast, the reason why the MR ratio lowers as the film thickness X4 increases is presumably that magnetic coupling between a perpendicular magnetization film 43 and a CoFeB film 41 through a Ta film 42 weakens. The preferable range of the film thickness X4 allowing an MR ratio of 25% or more is 0.3 to 0.6 nm.

5. Modified Examples

Figure 15:
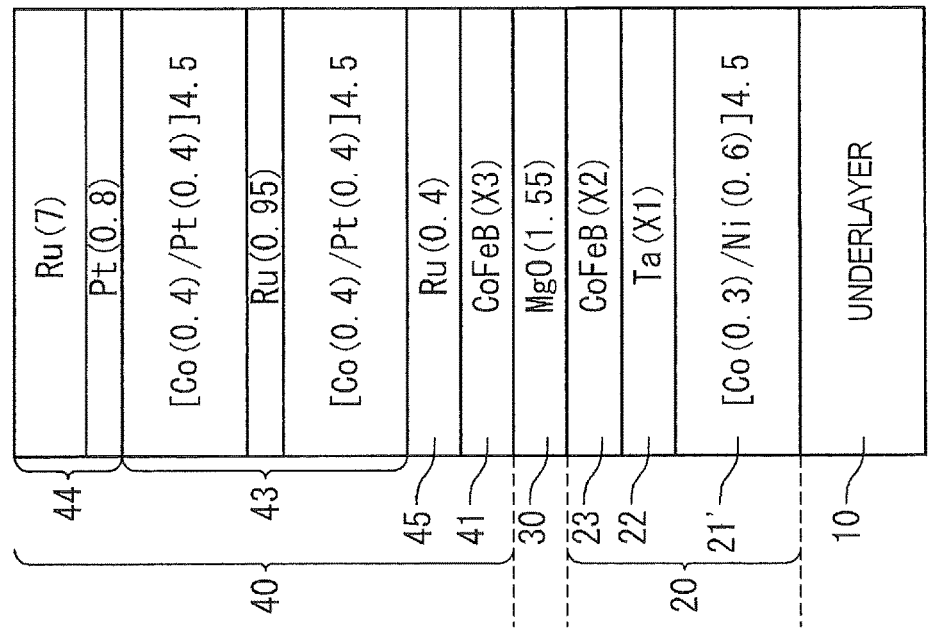
FIG. 15 shows a film configuration of a magnetoresistive effect element according to a modified example.

FIG. 15 shows a modified example. According to the modified example shown in FIG. 15, in a data storage layer 20, a perpendicular magnetization film 21' not including a Co/Pt/Co structure is used instead of the perpendicular magnetization film 21 stated above. A Ta film 22 is interposed between the perpendicular magnetization film 21' and a CoFeB film 23 and the perpendicular magnetization film 21' is magnetically coupled to the CoFeB film 23 through the Ta film 22. Further, in a data reference layer 40, a Ru film 45, instead of the Ta film 42 stated above, is interposed between a CoFeB film 41 and a perpendicular magnetization film 43. As long as a Ta film 22 is used at least in a data storage layer 20, a certain degree of effect is obtained also in the present modified example.

Figure 16:
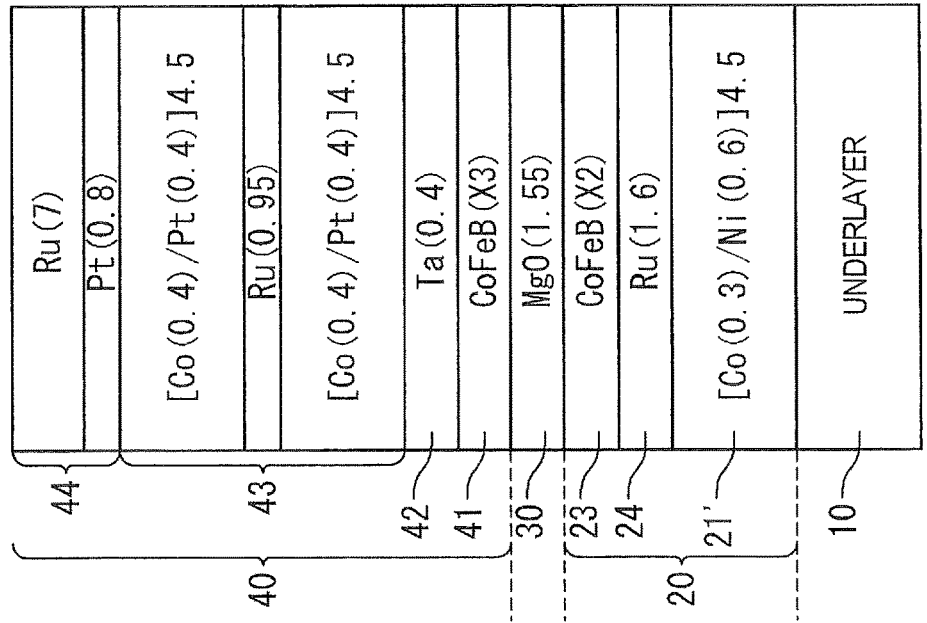
FIG. 16 shows a film configuration of a magnetoresistive effect element according to another modified example.

FIG. 16 shows another modified example. According to the modified example shown in FIG. 16, in a data storage layer 20, a perpendicular magnetization film 21' not including a Co/Pt/Co structure is used instead of the perpendicular magnetization film 21 stated above. Further, a Ru film 24, instead of the Ta film 22 stated above, is interposed between the perpendicular magnetization film 21' and a CoFeB film 23. A data reference layer 40 is the same as the above embodiment. As long as a Ta film 42 is used at least in a data reference layer 40, a certain degree of effect is obtained also in the present modified example.

Figure 17:
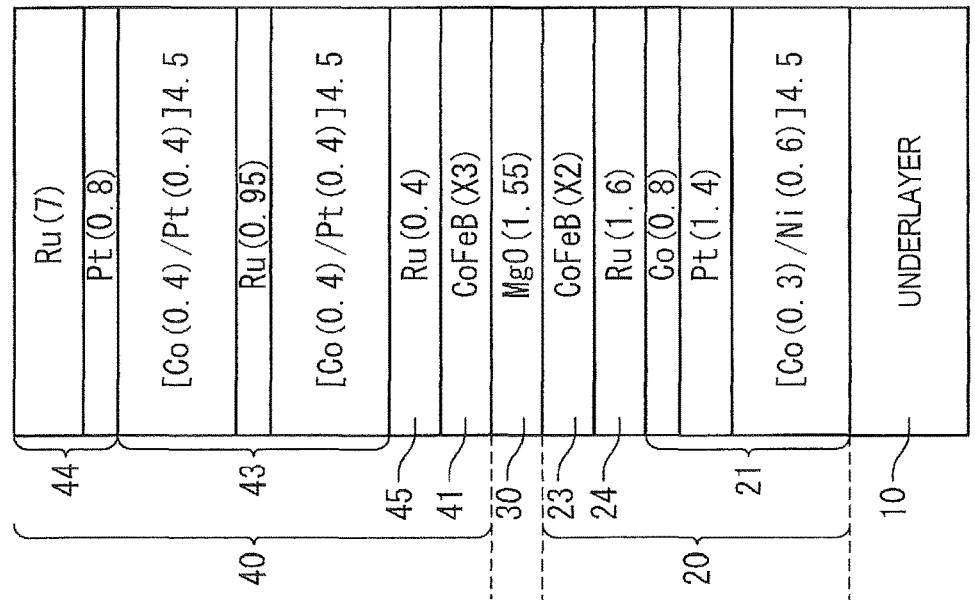
FIG. 17 shows a film configuration of a magnetoresistive effect element according to yet another modified example.

FIG. 17 shows yet another modified example. According to the modified example shown in FIG. 17, in a data storage layer 20, a Ru film 24, instead of the Ta film 22 stated above, is interposed between a perpendicular magnetization film 21 and a CoFeB film 23. Further, in a data reference layer 40, a Ru film 45, instead of the Ta film 42 stated above, is interposed between a CoFeB film 41 and a perpendicular magnetization film 43. The perpendicular magnetization film 21 in the data storage layer 20 is the same as the above embodiment. As long as a Co/Pt/Co structure is used at least in a data storage layer 20, a certain degree of effect is obtained also in the present modified example.

Figure 18:
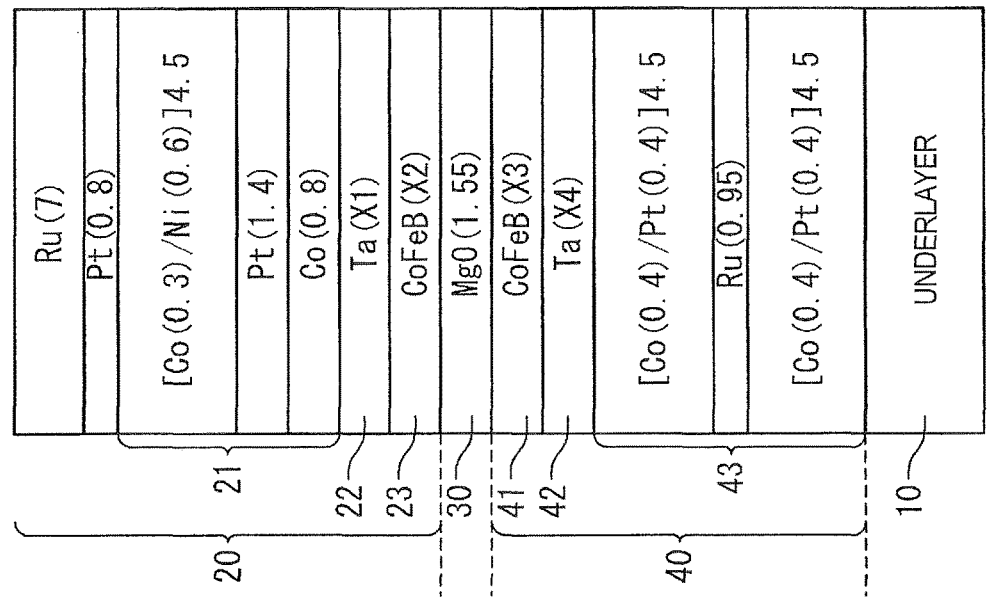
FIG. 18 shows a film configuration of a magnetoresistive effect element according to still another modified example.

FIG. 18 shows still another modified example. The vertically-structured relationship between a data storage layer 20 and a data reference layer 40 is reversed in comparison with the configuration shown in FIG. 5. The same effects as the above embodiment are obtained in the present modified example.

Further, the film configuration according to the present embodiment can be applied not only to a domain wall displacement type but also to a spin injection type or an external magnetic field application type. In any of the types, a magnetoresistive effect element 1 exhibiting a high MR ratio can be materialized.

Further, a combination of the above modified examples is also acceptable within the range not being contradictory to each other.

6. Application to Magnetic Memory

Figure 19:
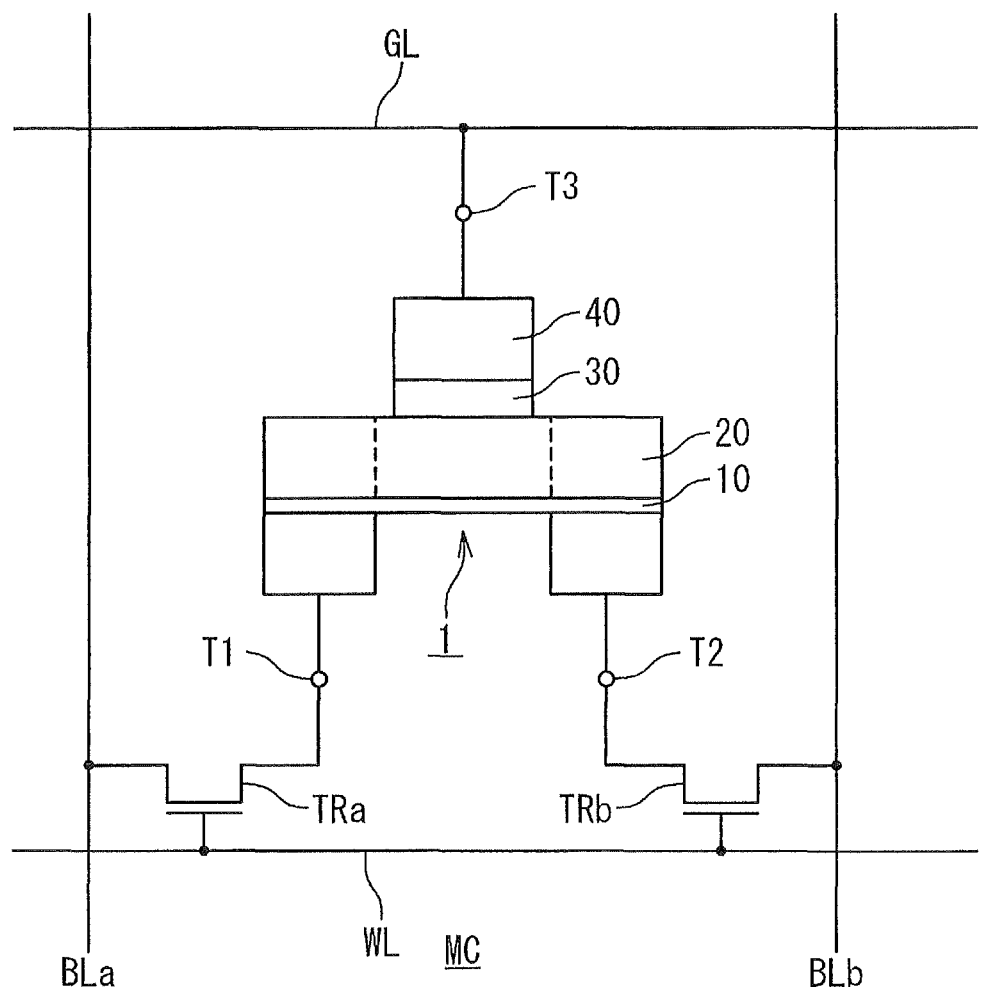
FIG. 19 shows an example of a structure of a memory cell using a magnetoresistive effect element according to the present embodiment.

FIG. 19 shows a configuration example of a memory cell MC using a magnetoresistive effect element 1 according to the present embodiment. A first terminal T1 is coupled to a first bit line BLa through a first selective transistor TRa. A second terminal T2 is coupled to a second bit line BLb through a second selective transistor TRb. Both the gates of the selective transistors TRa and TRb are coupled to a word line WL. A third terminal T3 is coupled to a ground line GL.

When data are written into the memory cell MC, the word line WL is set at a high level and the selective transistors TRa and TRb are turned on. Meanwhile, the ground line GL is set in a floating state. By applying potential difference corresponding to the written data between the first bit line BLa and the second bit line BLb, it is possible to supply writing current IW in a direction corresponding to the written data to a data storage layer 20.

Further, when data are read out from the memory cell MC, the word line WL is set at a high level and the selective transistors TRa and TRb are turned on. A ground potential is applied to the ground line GL, a prescribed readout potential is applied to the first bit line BLa, and the second bit line BLb is set in a floating state. In this way, readout current IR flows from the first bit line BLa to the ground line GL in the manner of passing through an MTJ.

Figure 20:
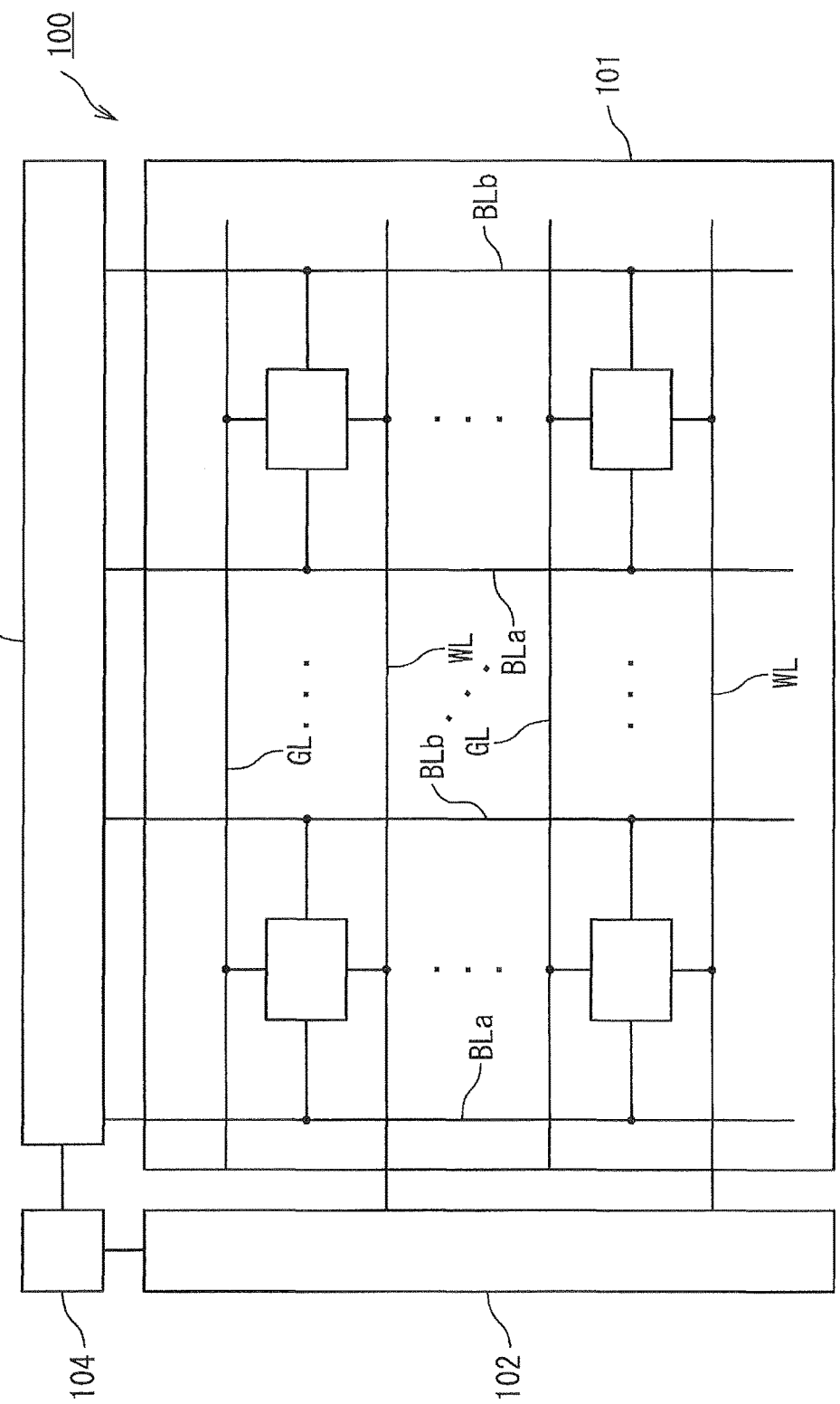
FIG. 20 is a block diagram showing an example of a configuration of a magnetic memory using the memory cell shown in FIG. 19.

FIG. 20 is a block diagram showing a configuration example of a magnetic memory 100 using a memory cell MC shown in FIG. 19. The magnetic memory 100 includes a memory cell array 101, a word line driver 102, a bit line driver 103, and a control circuit 104.

The memory cell array 101 includes a plurality of memory cells MC allocated in an arrayed manner, a plurality of word lines WL, a plurality of bit line pairs BLa and BLb, and a plurality of ground lines GL. One of the memory cells MC is coupled to one of the word lines WL, one pair of the bit line pairs BLa and BLb, and one of the ground lines GL as shown in FIG. 19.

The word line driver 102 is coupled to the plural word lines WL. The bit line driver 103 is coupled to the plural bit line pairs BLa and BLb. The control circuit 104 controls the operations of the word line driver 102 and the bit line driver 103. The word line driver 102 drives a selective word line WL in the plural word lines WL in accordance with a control signal from the control circuit 104. The bit line driver 103 controls the potential of a selective bit line pair BLa and BLb in the plural bit line pairs BLa and BLb in accordance with a control signal from the control circuit 104. In this way, it is possible to write and read data into and from a selective memory cell MC.

Embodiments according to the present invention have heretofore been explained in reference to attached drawings. The present invention however is not limited to the above embodiments and can be changed appropriately by a person skilled in the art within the range not deviating from the tenor of the present invention.

What is claimed is:

1. A magnetoresistive effect element, comprising:
   a data storage layer;
   a data reference layer where the magnetization direction is fixed in one direction; and
   an MgO film interposed between said data storage layer and said data reference layer,
   wherein said data storage layer comprises:
      a first CoFeB film coming into contact with said MgO film;
      a first perpendicular magnetization film; and
      a first Ta film interposed between said first CoFeB film and said first perpendicular magnetization film, said first Ta film being disposed on a surface of said first perpendicular magnetization film,
   wherein said first CoFeB film is magnetically coupled to said first perpendicular magnetization film through said first Ta film,
   wherein, in a side view, the data storage layer includes:
      a first region where a magnetization direction is invertible, the first region being disposed below the data reference layer;
      a second region where a magnetization direction is fixed in said one direction, the second region being disposed on a side of the first region; and
      a third region where a magnetization direction is fixed opposite to said one direction, the third region being disposed on another side of the first region, and
   wherein said first perpendicular magnetization film comprises:
      a first Co film coming into direct contact with said first Ta film; and
      a second Co film comprising a Co/Ni film.

2. A magnetoresistive effect element according to claim 1, wherein said data reference layer comprises a second CoFeB film coming into contact with said MgO film.

3. A magnetoresistive effect element according to claim 2, wherein said data reference layer further comprises:
   a second perpendicular magnetization film; and
   a second Ta film interposed between said second CoFeB film and said second perpendicular magnetization film, and
   wherein said second CoFeB film is magnetically coupled to said second perpendicular magnetization film through said second Ta film.

4. A magnetoresistive effect element according to claim 1, wherein said first perpendicular magnetization film further comprises:
   a Pt film interposed between said first Co film and said second Co film.

5. A magnetoresistive effect element, comprising:
   a data storage layer;
   a data reference layer where the magnetization direction is fixed in one direction; and
   an MgO film interposed between said data storage layer and said data reference layer,
   wherein said data reference layer comprises:
      a CoFeB film coming into contact with said MgO film;
      a perpendicular magnetization film; and
      a Ta film interposed between said CoFeB film and said perpendicular magnetization film, said Ta film being disposed on a surface of said perpendicular magnetization film,
   wherein said CoFeB film is magnetically coupled to said perpendicular magnetization film through said Ta film,
   wherein, in a side view, the data storage layer includes:
      a first region where a magnetization direction is invertible, the first region being disposed below the data reference layer;
      a second region where a magnetization direction is fixed in said one direction, the second region being disposed on a side of the first region; and a third region where a magnetization direction is fixed opposite to said one direction, the third region being disposed on another side of the first region, and wherein said data storage layer comprises another perpendicular magnetization film, comprising:
a second Ta film;
a first Co film coming into direct contact with said second Ta film: and
a second Co film comprising a Co/Ni film.

6. A magnetoresistive effect element, comprising:
a data storage layer;
a data reference layer where the magnetization direction is fixed in one direction; and
an MgO film interposed between said data storage layer and said data reference layer,
wherein said data storage layer comprises:
a CoFeB film coming into contact with said MgO film;
a perpendicular magnetization film magnetically coupled to said CoFeB film; and
a Ta film interposed between said CoFeB film and said perpendicular magnetization film, said Ta film being disposed on a surface of said perpendicular magnetization film,
wherein said perpendicular magnetization film comprises:
a first Co film closest to said CoFeB film;
a second Co film; and
a Pt film interposed between said first Co film and said second Co film, and
wherein, in a side view, the data storage layer includes:
a first region where a magnetization direction is invertible, the first region being disposed below the data reference layer;
a second region where a magnetization direction is fixed in said one direction, the second region being disposed on a side of the first region; and
a third region where a magnetization direction is fixed opposite to said one direction, the third region being disposed on another side of the first region, and
wherein said second Co film comprises a Co/Ni film.

7. A magnetic memory comprising a magnetoresistive effect element according to claim 1 as a memory cell.

8. A magnetoresistive effect element according to claim 1, wherein said data reference layer comprises:
a second CoFeB film contacting with said MgO film; and
a second Ta film disposed on a surface of said second CoFeB film.

9. A magnetoresistive effect element according to claim 8, wherein said data reference layer further comprises:
a second perpendicular magnetization film disposed on a surface of said second Ta film.

10. A magnetoresistive effect element according to claim 9, wherein said first perpendicular magnetization film comprises:
a first Co film contacting with said first Ta film;
a second Co film; and
a Pt film interposed between said first Co film and said second Co film, and
wherein said second perpendicular magnetization film comprises:
a third Co film contacting with said second Ta film;
a fourth Co film; and
a Ru film interposed between said third Co film and said fourth Co film.

11. A magnetoresistive effect element according to claim 1, further comprising:
a substrate, another surface of said first perpendicular magnetization film being disposed on an upper surface of the substrate.

12. A magnetoresistive effect element according to claim 5, wherein said data storage layer further comprises:
a second CoFeB film contacting with said MgO film; and
a second Ta film disposed on a surface of said second CoFeB film.

13. A magnetoresistive effect element according to claim 12, wherein:
said another perpendicular magnetization film abuts the surface of said second Ta film.

14. A magnetoresistive effect element according to claim 13, further comprising:
a substrate, another surface of said second perpendicular magnetization film being disposed on an upper surface of the substrate.

15. A magnetoresistive effect element according to claim 6, wherein said data reference layer comprises:
a second CoFeB film contacting with said MgO film; and
a second Ta film disposed on a surface of said second CoFeB film.

16. A magnetoresistive effect element according to claim 15, wherein said data reference layer further comprises:
a second perpendicular magnetization film disposed on a surface of said second Ta film.

17. A magnetoresistive effect element according to claim 16, wherein said second perpendicular magnetization film comprises:
a third Co film contacting with said second Ta film;
a fourth Co film; and
a Ru film interposed between said third Co film and said fourth Co film.

18. A magnetoresistive effect element according to claim 6, further comprising:
a substrate, another surface of said perpendicular magnetization film being disposed on an upper surface of the substrate.

19. A magnetoresistive effect element according to claim 1, wherein said second Co film comprises an outermost layer of said first perpendicular magnetization film.

20. A magnetoresistive effect element according to claim 1, wherein said second Co film comprises an outermost layer of said data storage layer.

* * * * *